US009413352B2

(12) United States Patent
Lim

(10) Patent No.: US 9,413,352 B2
(45) Date of Patent: Aug. 9, 2016

(54) ADJUSTABLE INTERNAL GATE RESISTOR

(71) Applicant: Infineon Technologies Austria AG, Villach (AT)

(72) Inventor: Hock Poh Lim, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/532,648

(22) Filed: Nov. 4, 2014

(65) Prior Publication Data

US 2016/0126949 A1    May 5, 2016

(51) Int. Cl.
| | |
|---|---|
| *H03K 17/56* | (2006.01) |
| *H03K 17/785* | (2006.01) |
| *H01C 7/00* | (2006.01) |
| *H05B 33/08* | (2006.01) |

(52) U.S. Cl.
CPC ............ *H03K 17/785* (2013.01); *H01C 7/00* (2013.01); *H05B 33/08* (2013.01)

(58) Field of Classification Search
USPC ......... 327/108, 109, 419, 423, 424, 427, 428, 327/434, 437
See application file for complete search history.

(56) References Cited

U.S. PATENT DOCUMENTS

| | | | | | |
|---|---|---|---|---|---|
| 4,030,041 | A  * | 6/1977 | Sasaki | ................... | H03F 3/387 330/10 |
| 6,563,379 | B1 * | 5/2003 | Potucek | ................ | H03F 3/085 330/127 |
| 8,648,790 | B2 * | 2/2014 | Kang | .................. | H05B 33/083 315/307 |

* cited by examiner

*Primary Examiner* — An Luu
(74) *Attorney, Agent, or Firm* — Shumaker & Sieffert, P.A.

(57) ABSTRACT

The disclosure describes a method for controlling a voltage that is applied to a voltage controlled circuit element. In one example, the method includes controlling, by a semiconductor light source, a resistance value of a photoresistor coupled to a voltage controlled circuit element. The method includes applying, by a gate driver and via the photoresistor, a voltage to the voltage controlled circuit element. The method further includes controlling the voltage applied to the voltage controlled circuit element in order to control a current through the voltage controlled circuit element. In some examples, controlling the voltage applied to the voltage controlled circuit element may be accomplished by controlling the resistance value of the photoresistor in order to control a voltage drop across the photoresistor. Circuits that implement the method are also described.

19 Claims, 8 Drawing Sheets the from the claims.

ADJUSTABLE INTERNAL GATE RESISTOR

TECHNICAL FIELD

The disclosure relates to voltage controlled circuit elements, in particular, field-effect transistors, such as metal-oxide-semiconductor field-effect transistors (MOSFETs).

BACKGROUND

A metal-oxide-semiconductor field-effect transistor (MOSFET) is one example of a voltage controlled circuit element that may be used as a power switch to control the flow of current in a power circuit (e.g., a switch-mode power supply). An insulated-gate bipolar transistor is another example of a voltage controlled circuit element that may be used as a power switch to control the flow of current in a power circuit. During regular switching operations of a voltage controlled circuit element, the voltage controlled circuit element may suffer from abnormal operating conditions that can cause damage or otherwise disrupt the voltage controlled circuit element.

SUMMARY

In general, techniques and circuits are described for providing an adjustable gate resistor that is internal to the package of a voltage controlled circuit element. For example, a package including voltage controlled circuit element, such as a MOSFET, may also include a photoresistor and a semiconductor light source. The resistance of the photoresistor may adjusted by adjusting the light generated by the semiconductor light source. The semiconductor light source used to control the photoresistor may include a light emitting diode (LED).

In some examples, the LED and photoresistor may be encased in a transparent material, which may be surrounded by an opaque material to isolate the photoresistor from any light except for light from the LED. The LED may also be configured to deliver light into a light guide material that delivers the light to the photoresistor. For example, the light guide material may be positioned in proximity to the LED with an opaque material covering some or all of the elements in the package.

In one example, the disclosure is directed to a method including controlling, by a semiconductor light source, a resistance value of a photoresistor coupled to a voltage controlled circuit element, and applying a voltage to the voltage controlled circuit element, wherein controlling the resistance value of the photoresistor controls a voltage drop across the photoresistor to control the voltage applied at the voltage controlled circuit element so as to control a current through the voltage controlled circuit element.

In another example, the disclosure is directed to a circuit element including a voltage controlled circuit element, a photoresistor coupled to the voltage controlled circuit element, and a semiconductor light source, and the semiconductor light source is configured to adjust a resistance value of the photoresistor, and wherein the voltage controlled circuit element, the photoresistor, and the semiconductor light source are located within a package.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
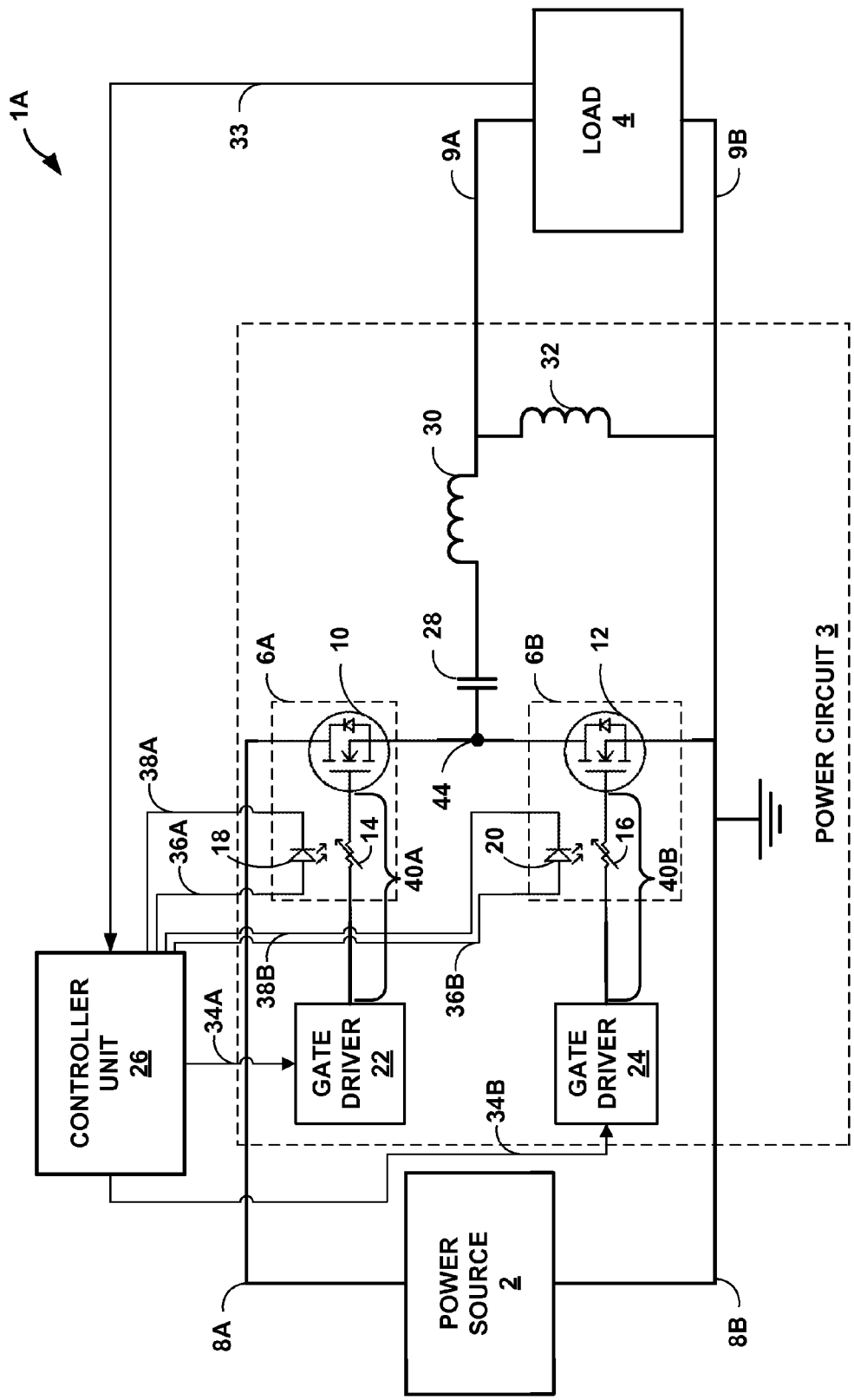
FIG. 1 is a circuit diagram illustrating an example of a system for powering a load that includes a package with an adjustable internal gate resistor configured to reduce gate oscillation at the voltage controlled circuit element, in accordance with one or more aspects of the present disclosure.

Power converters (e.g., a LLC converter, a phase shift zero-voltage-switching converter, a triangular current mode power factor correction stage converter, a synchronous buck converter, and the like) may include a voltage controlled circuit element in a half-bridge circuit. A typical half-bridge circuit includes a high-side voltage controlled circuit element (e.g., a switching element, such as a power MOSFET) coupled to a low-side element at a switching node. A power circuit operates a half-bridge circuit by modulating the high-side voltage controlled circuit element in such a way as to vary the level of an output voltage at the switching node.

During regular switching operations, a voltage controlled circuit element may suffer from abnormal operating conditions (e.g., high-voltage or high currents at the MOSFET) that can cause damage or otherwise disrupt the voltage controlled circuit element. A gate oscillation (e.g., the oscillation of the gate-to-source voltage $V_{gs}$) of the voltage controlled circuit element is one type of abnormal operating condition that, during switching may cause an electromagnetic interference (EMI) issue, which can damage or completely destroy the voltage controlled circuit element.

Some power circuits may try to prevent gate oscillation from occurring by using an external gate resistor in series between the driver output and the gate terminal of the voltage controlled circuit element. Such a gate resistor may enable a voltage controlled circuit element to attenuate the gate oscillation by having a sufficient external gate resistance. This technique may be effective in preventing the gate oscillation at a voltage controlled circuit element and may allow the voltage controlled circuit element to survive abnormal operations. However, this technique also slows down the switching speed of the voltage controlled circuit element and as a result, may reduce the overall efficiency of the power circuit. Introduction of an external gate resistor also increases the printed circuit board trace for the gate path (the path between the driver output and the gate terminal of the voltage controlled circuit element). This increase in the gate path may also increase gate stray inductance, which may also contribute to the gate oscillation of the voltage controlled circuit element.

The techniques and circuits described herein provide various ways of at least reducing gate oscillation of a voltage controlled circuit element. The techniques and circuits described herein may be used in any circuit that uses a voltage controlled circuit element, including, but not limited to, AC-to-DC converters, DC-to-AC converters, DC-to-DC converters, AC-to-AC converter, or other circuits having a voltage controlled circuit element. In some examples, a package may include the voltage controlled circuit element, along with a photoresistor and a semiconductor light source. In these examples, the photoresistor and the semiconductor light source form an "adjustable internal gate resistor," which may provide isolation for controlling the gate resistance value from a high speed switching circuit. As examples, the voltage controlled circuit element may include a MOSFET, an insulated-gate bipolar transistor, or another type of transistor or element that uses a voltage for its control signal.

The internal gate resistor (i.e., in the form of a photoresistor that is controlled by a semiconductor light source) may also be adjusted to attenuate the gate oscillation with a lower effective gate resistance value than the effective resistance value of an external gate resistor. In other words, the package may have an adjustable internal gate resistor located near the gate of the voltage controlled circuit element that may be adjusted (e.g., "tuned") to reduce gate oscillation of the voltage controlled circuit element, which is more efficient than using an external gate resistor with a fixed resistance value farther away from the gate of the voltage controlled circuit element. The adjustment of the internal gate resistor, in some examples, may be based upon the characteristics of the voltage controlled circuit element. Additionally or alternatively, the adjustment of the internal gate resistor, in some examples, may eliminate the need to have two external gate resistors coupled to two external diodes. For example, instead of a TURN ON gate resistor coupled to a TURN ON diode and a TURN OFF gate resistor coupled to a TURN OFF diode, a single adjustable internal gate resistor may be adjusted between a TURN ON resistance value and a TURN OFF resistance value.

In some examples, a package including a combination of a controller unit, a gate driver, the adjustable internal gate resistor, and the voltage controlled circuit element may help lower part counts, which may reduce costs and the overall size of the circuit board. In these examples, the package may provide a higher power density per square inch.

The following techniques and circuits described herein present several ways to reduce gate oscillation of a voltage controlled circuit element. The techniques described herein can be used in any permutation, and in any combination, to prevent or reduce damage from occurring as a result of gate oscillation of a voltage controlled circuit element.

FIG. 1 is a circuit diagram illustrating an example of a system for powering a load that includes a package with an adjustable internal gate resistor configured to reduce gate oscillation at the voltage controlled circuit element, in accordance with one or more aspects of the present disclosure. In the example of FIG. 1, system 1 includes power source 2, power circuit 3, load 4, and controller unit 26. In some examples, system 1 may include additional or fewer components and provide the functionality of system 1 as described herein.

System 1 includes power source 2 which provides electrical energy in the form of power to system 1. Numerous examples of power source 2 exist and may include, but are not limited to, power grids, generators, power transformers, batteries, solar panels, windmills, degenerative braking systems, hydro electrical generators, or any other form of electrical power devices capable of providing electrical power to system 1.

System 1 also includes load 4 which receives the electrical power (e.g., voltage, current, etc.) provided by power source 2 and converted by power circuit 3, in some examples, to perform a function. Numerous examples of load 4 exist and may include, but are not limited to, computing devices and related components, such as microprocessors, electrical components, circuits, laptop computers, desktop computers, tablet computers, mobile phones, batteries, speakers, lighting units, automotive/marine/aerospace/train related components, motors, transformers, or any other type of electrical device and/or circuitry that receives a voltage or a current from a power converter.

System 1 may include controller unit 26. Controller unit 26 may comprise any suitable arrangement of hardware, software, firmware, or any combination thereof, to perform the techniques attributed to controller unit 26 herein. Controller unit 26 may be coupled to load 4 via a wired or wireless link 33 to receive feedback regarding the load condition of load 4. Controller unit 26 may be coupled to gate driver 22 and 24 via a wired or wireless link 34A and 34B to send and/or receive signals or commands to gate driver 22 and 24 for controlling the operations of power circuit 3. In some examples, controller unit 26 may also be coupled to semiconductor light source 18 and 20 via link 36A and 38A, 36B and 38B to control light generation (e.g., provide a current to generate an amount of light). For example, controller unit 26 may include any one or more microprocessors, digital signal processors (DSPs), application specific integrated circuits (ASICs), field programmable gate arrays (FPGAs), or any other equivalent integrated or discrete logic circuitry, as well as any combinations of such components. When controller unit 26 includes software or firmware, controller unit 26 further includes any necessary hardware for storing and executing the software or firmware, such as one or more processors or processing units. In general, a processing unit may include one or more microprocessors, DSPs, ASICs, FPGAs, or any other equivalent integrated or discrete logic circuitry, as well as any combinations of such components. In some examples, the determinations made by controller unit 26 may be made by either driver 22 or driver 24. In other examples, controller unit 26 may be incorporated in either driver 22 or driver 24. In yet other examples, driver 22 and 24 may be a single driver, which incorporates the functions of controller unit 26.

Links 8A and 8B (collectively "links 8"), links 9A and 9B (collectively "links 9"), link 33, links 34A and 34B (collectively "links 34"), links 36A and 36B (collectively "links 36"), and links 38A and 38B (collectively "links 38") represent any medium capable of conducting electrical signals from one location to another. Examples of links 8-10, and 33-38 include, but are not limited to, physical and/or wireless electrical transmission mediums such as electrical wires, electrical traces, conductive gas tubes, twisted wire pairs, and the like. Power source 2 may provide electrical power with a first voltage or current over link 8 and load 4 may receive electrical power, converted by power circuit 3 to have a second voltage or current, over links 9. Links 9 provide electrical coupling between power circuit 3 and load 4 and link 8 provides electrical coupling between power source 2 and power circuit 3. Load 4 is electrically coupled to power circuit 3 which is electrically coupled to power source 2. Link 33 may provide electrical coupling for feedback regarding the load condition of load 4 to controller unit 26. Links 34 may provide electrical coupling for communication between controller unit 26 and each of drivers 22 and 24. Links 36 and 38 may provide electrical coupling for current delivery between semiconductor light source 18 and 20 and controller unit 26. For example, a signal over links 36 and 38 may be an amount of current delivery between semiconductor light source 18 and 20 and controller unit 26. In some examples, a signal over links 36 and 38 may be selected by controller unit 26 to generate a particular amount of light by semiconductor light source 18 or 20. In other examples, a signal over links 36 and 38 may be selected by controller unit 26 to generate two amounts of light by semiconductor light source 18 or 20. In these examples, a first amount of light may correspond to a TURN ON resistance value of photoresistor 14 or 16 and a second amount of light may correspond to a TURN OFF resistance value of photoresistor 14 or 16.

System 1 also includes power circuit 3 which operates as an intermediary device for converting the electrical energy provided by power source 2 into a different, usable form of electrical energy for powering load 4. In the example of FIG. 1, power circuit 3 is configured to operate as a switch-based power converter that converts electrical energy provided by power source 2 into a usable form of electrical power for load 4. Power circuit 3 includes an LLC filter made up of capacitor 28, inductor 30, and inductor 32. Power circuit 3 uses the LLC filter to filter the voltage or current that power circuit 3 outputs to load 4. In some examples, additional or different types of filters may be used. In some examples, power circuit 3 may include additional or fewer elements than those shown in FIG. 1.

Power circuit 3 includes packages 6A and 6B arranged in a half-bridge configuration about switching node 44. Package 6A includes voltage controlled circuit element 10, photoresistor 14, and semiconductor light source 18. Package 6B includes voltage controlled circuit element 12, photoresistor 16, and semiconductor light source 20. In some examples, semiconductor light source 18 and 20 and photoresistor 14 and 16, respectively, may be encased in a transparent material, which may be surrounded by an opaque material to isolate photoresistor 14 and 16 from any light except for light from semiconductor light source 18 and 20. In some examples, the transparent material may include, but not limited to, polymers, glass, or another transparent material that may be capable of having a clear molded shell which may enable the light from a semiconductor light source to be delivered to a photoresistor, and temperature insulate the photoresistor. Semiconductor light source 18 and 20 may also be configured to deliver light into a light guide material that delivers the light to photoresistor 14 and 16. For example, the light guide material may be positioned in proximity to semiconductor light source 18 and 20 with an opaque material covering some or all of the elements in package 6A and 6B. In some examples, the opaque material may include, but not limited to, resin, polymer, plastic mold compound, ceramic, or another opaque material that may be capable of insulating light from a photoresistor from an external source.

Voltage controlled circuit element 10 and 12 may include any electrical device that is controlled by a voltage. Although, a MOSFET symbol is shown in FIG. 1 as voltage controlled circuit element 10 and 12, it is contemplated that any electrical device that is controlled by a voltage may be used in place of the MOSFET as shown. For example, voltage controlled circuit element 10 and 12 may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Photoresistor 14 and 16 may include any electrical device that may vary its resistance according to incident light, that is, exhibits photoconductivity (e.g., a photoresistor, a light-dependent resistor (LDR), a photocell, or another element that varies resistance according to incident light). Photoresistor 14 and 16 are gate resistors connected respectively, between the output of driver 22 and the gate terminal of voltage controlled circuit element 10, and between the output of driver 24 and the gate terminal of voltage controlled circuit element 12. In some examples, the resistance value of photoresistor 14 and 16 may decrease as an increase of incident light is delivered to photoresistor 14 and 16. In other examples, the resistance value of photoresistor 14 and 16 may increase as a decrease of incident light is delivered to photoresistor 14 and 16. In other words, photoresistor 14 and 16 may be a negative coefficient photoresistor. In some examples, the resistance value of photoresistor 14 and 16 may decrease as a decrease of incident light is delivered to photoresistor 14 and 16. In other examples, the resistance value of photoresistor 14 and 16 may increase as an increase of incident light is delivered to photoresistor 14 and 16. In other words, photoresistor 14 and 16 may be a positive coefficient photoresistor.

Semiconductor light source 18 and 20 may include any electrical device that emits light when activated, that is, exhibits electroluminescence (e.g., light-emitting diode (LED), organic light-emitting diode (OLED), quantum dot light-emitting diodes (QD-LED), or another device capable of delivering a light signal). Semiconductor light source 18 and 20 in combination with photoresistors 14 and 16 may form a respective adjustable internal gate resistor with respect to packages 6A and 6B.

In the example of FIG. 1, package 6A is a high-side switching element and package 6B is a low-side switching element. By controlling (e.g., modulating) packages 6A and 6B, power circuit 3 may vary the voltage or current at switching node 44 and as a result, provide power to load 4. For example, power circuit 3 may control packages 6A and 6B according to pulse-width modulation (PWM) techniques, pulse-depth modulation (PDW) techniques, pulse-amplitude modulation (PAM) techniques, pulse-position modulation (PPM) techniques, and the like.

The techniques are described herein with respect to package 6A and gate driver 22. However, the techniques described herein can be used in any permutation, and in any combination, with package 6B and gate driver 24 to prevent or reduce damage from occurring as a result of gate oscillation (e.g., the oscillation of a gate-to-source voltage $V_{gs}$) of a voltage controlled circuit element. In some examples, semiconductor light source 18 may generate a fixed amount of light, which may cause photoresistor 14 to have a fixed resistance value. In other examples, semiconductor light source 18 may be adjusted by controller unit 26 to generate more than one amount of light, which may cause photoresistor 14 to have more than one resistance value. For instance, photoresistor 14 may have a low resistance value (e.g., 1 ohm). In other examples, photoresistor 14 may have a high resistance value (e.g., 5 ohms, 10 ohms, 20 ohms, or another high resistance value).

Gate driver 22 and 24 may each include a component that drives the gate of respective voltage controlled circuit element 10 and 12 to cause the respective voltage controlled circuit element 10 and 12 to enter an ON state and an OFF state. In the example of FIG. 1, gate driver 22 may be distance 40A away from voltage controlled circuit element 10 of package 6A. Distance 40A may be the distance associated with an electrical trace between the output of gate driver 22 and the gate of voltage controlled circuit element 10. In some examples, distance 40A of the electrical trace may be associated with a gate stray inductance and gate-drain capacitance. Gate driver 22 and 24 may each comprise any suitable arrangement of hardware, software, firmware, or any combination thereof, to perform the techniques attributed to controller unit 26 herein, such as, but not limited to, providing a respective current to semiconductor light source 18 or 20 to generate a particular amount of light. In some examples, the determinations made by controller unit 26 may be made by either gate driver 22 or gate driver 24. In other examples, controller unit 26 may be incorporated in either gate driver 22 or gate driver 24. In yet other examples, gate driver 22 and 24 may be a single driver, which incorporates the functions of controller unit 26.

In some examples, gate driver 22 may be placed in package 6A, because voltage controlled circuit element 10 is connected to an internal photoresistor 14 instead of an external gate resistor, which may further reduce the gate path, the gate stray inductance, and the gate-drain coupling capacitance. For instance, gate driver 22 may be placed on the same semiconductor die as voltage controlled circuit element 10, photoresistor 14, and semiconductor light source 18. In these examples, further reducing the gate path may also attenuate the gate oscillation by a lower effective gate resistance value than the effective resistance value of an external gate resistor.

Controller unit 26 may be configured to control semiconductor light source 18 in package 6A, in order to control the resistance of photoresistor 14. For example, controller unit 26 may include one or more current sources coupled to the package 6A via links 36A and 38A. The current sources may deliver an amount current via links 36A and 38A to semiconductor light source 18 so as to control the amount of light produced, and thereby control the resistance of photoresistor 14. In some examples, controller unit 26 may increase the amount of current delivered to semiconductor light source 18, which may increase the amount of light delivered to photoresistor 14 and decrease the resistance value of photoresistor 14. In other examples, controller unit 26 may decrease the amount of current delivered to semiconductor light source 18, which may decrease the amount of light delivered to photoresistor 14 and increase the resistance value of photoresistor 14.

Controller unit 26 may also be configured to determine whether voltage controlled circuit element 10 may be transitioning to or operating in an ON state or an OFF state based on feedback from load 4 via link 33. Based on the feedback, controller unit 26 may trigger gate driver 22 to transition to an ON state or an OFF state by providing a HIGH or LOW gate drive signal, and simultaneously change the current through semiconductor light source 18, in order to change the TURN ON/OFF resistance of photoresistor 14 accordingly. In this manner, the HIGH or LOW gate drive signal to gate driver 22 corresponds to a TURN ON or TURN OFF resistance of photoresistor 14. In other words, controller unit 26 may determine the HIGH/LOW state for voltage controlled circuit element 10 and the TURN ON/OFF resistance of photoresistor 14 by the HIGH or LOW gate drive signal. In some examples, the resistance value of photoresistor 14 is important during the switching-on and switching-off phase of the voltage controlled circuit element 10, and must be set right before voltage controlled circuit element 10 transitions between the ON/OFF states. In some examples, the gate drive signal may be a pulse-width modulation (PWM) signal or a pulse-duration modulation (PDM) signal. In one example, controller unit 26 may activate a TURN ON resistance value (e.g., 1 ohm) of package 6A whenever voltage controlled circuit element 10 will be transitioning to or operating in an ON state, where the ON state may be based on a HIGH PWM signal. In other words, the TURN ON resistance value of package 6A may be activated prior to voltage controlled circuit element 10 transitioning to or operating in the ON state. In contrast, controller unit 26 may activate a TURN OFF resistance value (e.g., 10 ohms) of package 6A, whenever voltage controlled circuit element 10 will be transitioning to or operating in an OFF state, where the OFF state may be based on a LOW PWM signal. In other words, the TURN OFF resistance value of package 6A may be activated prior to voltage controlled circuit element 10 transitioning to or operating in the OFF state. In another example, controller unit 26 may activate a TURN ON resistance value of package 6B whenever voltage controlled circuit element 12 will be transitioning to or operating in an ON state. In contrast, controller unit 26 may activate a TURN OFF resistance value of package 6B, whenever voltage controlled circuit element 12 will be transitioning to or operating in an OFF state.

In some examples, photoresistor 14 may be adjusted with semiconductor light source 18 to have a fixed resistance value to prevent or reduce the gate oscillation of voltage controlled circuit element 10 during switching operations. In other examples, photoresistor 14 may be adjusted with semiconductor light source 18 to apply a TURN ON resistance value to the gate of voltage controlled circuit element 10. The TURN ON resistance value may allow gate driver 22 to turn-on voltage controlled circuit element 10 very fast compared to turning on voltage controlled circuit element 10 with only a fixed resistance value. In these examples, the TURN ON resistance value and the TURN OFF resistance value may be adjusted (e.g., "tuned" to a specific resistance value from a range of resistance values), with respect to voltage controlled circuit element 10, to maximize power efficiency and minimize gate oscillation. In other examples, photoresistor 14 may be adjusted to apply a TURN OFF resistance value to the gate of voltage controlled circuit element 10. The TURN OFF resistance value may allow gate driver 22 to turn-off voltage controlled circuit element 10 very fast compared to turning off voltage controlled circuit element 10 with only a fixed resistance value. In these examples, the TURN ON resistance value and the TURN OFF resistance value may be adjusted (e.g., "tuned" to a specific resistance value from a range of resistance values) according to voltage controlled circuit element 10 to maximize power efficiency and minimize gate oscillation.

In some examples, controller unit 26 may be located external to package 6A. In these examples, controller unit 26 may individually control semiconductor light source 18 according to the specific characteristics of voltage controlled circuit element 10. For example, controller unit 26 may provide an amount of current to semiconductor light source 18 via links 36A and 38A to generate an amount of light, which may cause photoresistor 14 to have a fixed resistance value according the amount of light generated. In other examples, controller unit 26 may provide an amount of current to semiconductor light source 18 via links 36A and 38A based on whether voltage controlled circuit element 10 will be transitioning to or operating in an ON state or an OFF state. In these examples, the amount of current provided to semiconductor light source 18 may generate an amount of light, which may cause photoresistor 14 to have a specific or selected resistance value (e.g., a TURN ON resistance value or a TURN OFF resistance value).

The techniques are described above with respect to package 6A and gate driver 22. However, the techniques described above can be used in any permutation, and in any combination, with package 6B and gate driver 24 to prevent or reduce damage from occurring as a result of gate oscillation of a voltage controlled circuit element.

Figure 2:
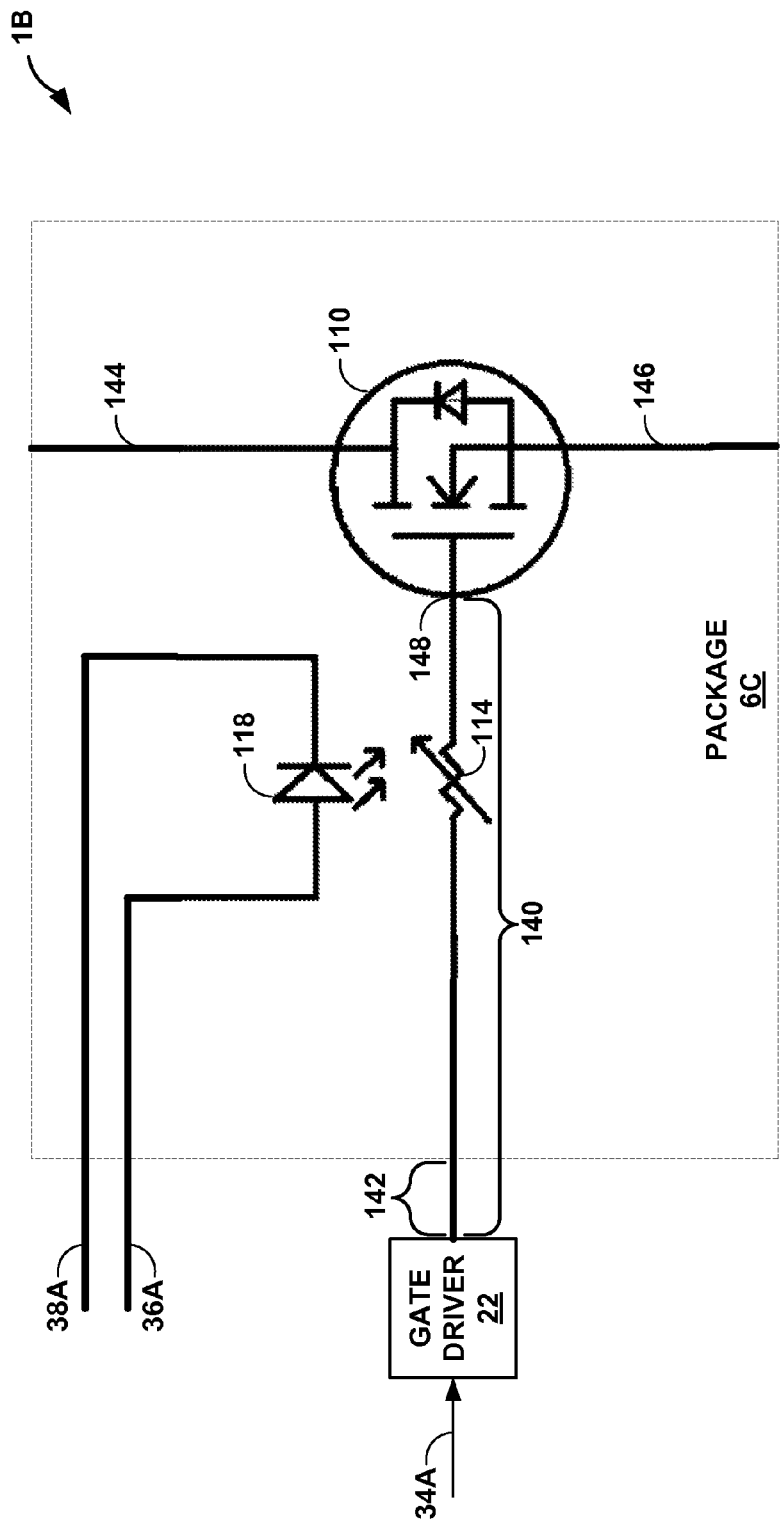
FIG. 2 is a circuit diagram illustrating an additional example of a package with an adjustable internal gate resistor configured to reduce gate oscillation at the voltage controlled circuit element, in accordance with one or more aspects of the present disclosure.

FIG. 2 is a circuit diagram illustrating an additional example of a package with an adjustable internal gate resistor configured to reduce gate oscillation at the voltage controlled circuit element, in accordance with one or more aspects of the present disclosure. FIG. 2 is described below within the context of system 1 of FIG. 1, and package 6A and gate driver 22. However, the techniques described below can be used in any permutation, and in any combination, with package 6B and gate driver 24 to prevent or reduce damage from occurring as a result of gate oscillation of a voltage controlled circuit element.

In the example of FIG. 2, system 1B includes gate driver 22, link 34A, link 36A, and link 38A as described in FIG. 1. In the example of FIG. 2, system 1B further includes package 6C, which may include voltage controlled circuit element 110, photoresistor 114, and semiconductor light source 118. The components of package 6C may correspond to voltage controlled circuit element 10, photoresistor 14, and semiconductor light source 18 as described in FIG. 1. Although, a MOSFET symbol is shown in FIG. 2 as voltage controlled circuit element 110, any electrical device that is controlled by a voltage may be used in place of the MOSFET as described in FIG. 1 with respect voltage controlled circuit element 10. Package 6C also includes drain 144, source 146, and gate 148.

Distance 140 may correspond to distance 40A as described in FIG. 1, and may be the distance of an electrical trace between the output of gate driver 22 and the gate of voltage controlled circuit element 110. Distance 142 is the distance of an electrical trace between the output terminal of gate driver 22 and package 6C. Drain 144 is the drain terminal of voltage controlled circuit element 110, which may be connected to power source 2 via link 8A or capacitor 28 via switching node 44. Source 146 is a source terminal of voltage controlled circuit element 110, which may be connected to power source 2 via link 8B or capacitor 28 via switching node 44. Gate 148 is a gate terminal of voltage controlled circuit element 110 coupled to gate driver 22 via photoresistor 114, and receives a voltage from gate driver 22 to either turn-on or turn-off voltage controlled circuit element 110.

In some examples, distance 140 and 142 may be reduced because there is no external gate resistor between gate driver 22 and package 6C. In some examples, distance 140 may be between 3 millimeters and 5 millimeters depending on the size of the internal gate resistor. In some examples, distance 142 may be between 1 millimeter and 2 millimeters depending on the package type (e.g., leadless or through hole) and the size of the internal gate resistor. In these examples, the gate stray inductance and gate-drain capacitance across distance 140 and associated with the electrical trace may be less than the gate stray inductance and gate-drain capacitance from an electrical trace with a distance that has an external gate resistor between gate driver 22 and package 6C. The smaller gate stray inductance and gate-drain capacitance associated with distance 140 may help attenuate the gate oscillation and prevent or at least reduce the damage caused by the electromagnetic interference.

In some examples, controller unit 26 may be located external to package 6C. In these examples, controller unit 26 may individually control semiconductor light source 118 according to the specific characteristics of voltage controlled circuit element 110. For example, controller unit 26 may provide an amount of current to semiconductor light source 118 via links 36A and 38A to generate an amount of light, which may cause photoresistor 114 to have a fixed resistance value according the amount of light generated. In other examples, controller unit 26 may provide an amount of current to semiconductor light source 118 via links 36A and 38A based on whether voltage controlled circuit element 110 will be transitioning to or operating in an ON state or an OFF state. In these examples, the amount of current provided to semiconductor light source 118 may generate an amount of light, which may cause photoresistor 114 to have a specific or selected resistance value (e.g., a TURN ON resistance value or a TURN OFF resistance value).

In some examples, semiconductor light source 118 and photoresistor 114 may be encased in a transparent material, which may be surrounded by an opaque material to isolate photoresistor 114 from any light except for light from semiconductor light source 118. Semiconductor light source 118 may also be configured to deliver light into a light guide material that delivers the light to photoresistor 114. For example, the light guide material may be positioned in proximity to semiconductor light source 118 with an opaque material covering some or all of the elements in package 6C.

Figure 3:
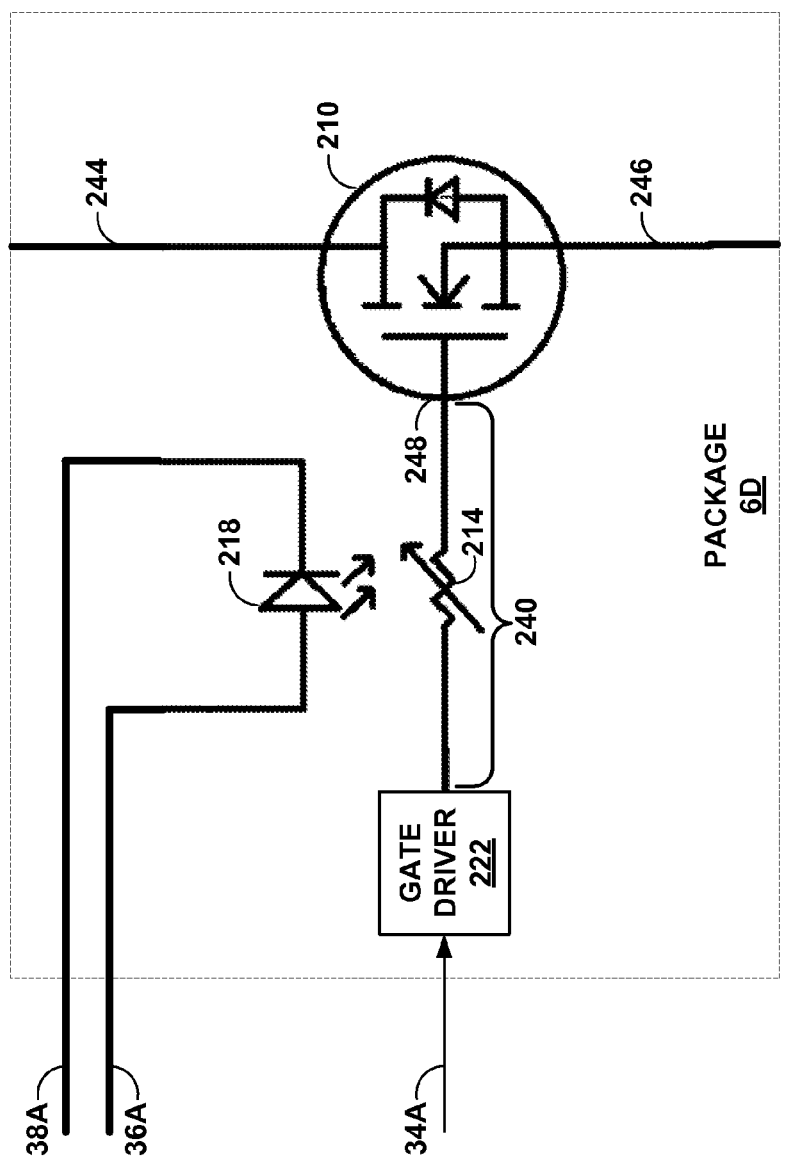
FIG. 3 is a circuit diagram illustrating an additional example of a package with an adjustable internal gate resistor configured to reduce gate oscillation at the voltage controlled circuit element, in accordance with one or more aspects of the present disclosure.

FIG. 3 is a circuit diagram illustrating an additional example of a package with an adjustable internal gate resistor configured to reduce gate oscillation at the voltage controlled circuit element, in accordance with one or more aspects of the present disclosure. FIG. 3 is described below within the context of system 1 of FIG. 1, and package 6A and gate driver 22. However, the techniques described below can be used in any permutation, and in any combination, with package 6B and gate driver 24 to prevent or reduce damage from occurring as a result of gate oscillation of a voltage controlled circuit element.

In the example of FIG. 3, package 6D includes link 34A, link 36A, and link 38A as described in FIG. 1. Package 6D also includes voltage controlled circuit element 210, photoresistor 214, semiconductor light source 218, and gate driver 222. The components of package 6D may correspond to voltage controlled circuit element 10, photoresistor 14, semiconductor light source 18, and gate driver 22 as described in FIG. 1. Additionally, package 6D may further include drain 244, source 246, and gate 248. Although, a MOSFET symbol is shown in FIG. 3 as voltage controlled circuit element 210, any electrical device that is controlled by a voltage may be used in place of the MOSFET as described in FIG. 1 with respect voltage controlled circuit element 10.

Gate driver 222 may correspond to gate driver 22 and may be located within package 6D. Drain 244 is the drain terminal of voltage controlled circuit element 210, which may be connected to power source 2 via link 8A or capacitor 28 via switching node 44. Source 246 is a source terminal of voltage controlled circuit element 210, which may be connected to power source 2 via link 8B or capacitor 28 via switching node 44. Gate 248 is a gate terminal of voltage controlled circuit element 210 coupled to gate driver 222 via photoresistor 214, and receives a voltage from gate driver 222 to either turn-on or turn-off voltage controlled circuit element 210.

Distance 240 may be the distance associated with an electrical trace between the output of gate driver 222 and the gate of voltage controlled circuit element 210. In some examples, distance 240 may be substantially less than distance 40A and 140 as described in FIGS. 1-2 because gate driver 222 is located in package 6D. In some examples, gate driver 222 may be located on the same semiconductor die as voltage controlled circuit element 210. In these examples, the gate stray inductance and the gate-drain capacitance across distance 240 of the electrical trace may be smaller than the gate stray inductance and the gate-drain capacitance associated with distance 40A of electrical trace because gate driver 222 is located in the same package. The smaller gate stray inductance and gate-drain capacitance across distance 240 of the electrical trace may help attenuate the gate oscillation and prevent or at least reduce the damage caused by the electromagnetic interference.

In some examples, controller unit 26 may be located external to package 6D. In these examples, controller unit 26 may individually control semiconductor light source 218 according to the specific characteristics of voltage controlled circuit element 210. For example, controller unit 26 may provide an amount of current to semiconductor light source 218 via links 36A and 38A to generate an amount of light, which may cause photoresistor 214 to have a fixed resistance value according the amount of light generated. In other examples, controller unit 26 may provide an amount of current to semiconductor light source 218 via links 36A and 38A based on whether voltage controlled circuit element 210 will be transitioning to or operating in an ON state or an OFF state. In these examples, the amount of current provided to semiconductor light source 218 may generate an amount of light, which may cause photoresistor 214 to have a specific or selected resistance value (e.g., a TURN ON resistance value or a TURN OFF resistance value).

In some examples, semiconductor light source 218 and photoresistor 214 may be encased in a transparent material, which may be surrounded by an opaque material to isolate photoresistor 214 from any light except for light from semiconductor light source 218. Semiconductor light source 218 may also be configured to deliver light into a light guide material that delivers the light to photoresistor 214. For example, the light guide material may be positioned in proximity to semiconductor light source 218 with an opaque material covering some or all of the elements in package 6D.

Figure 4:
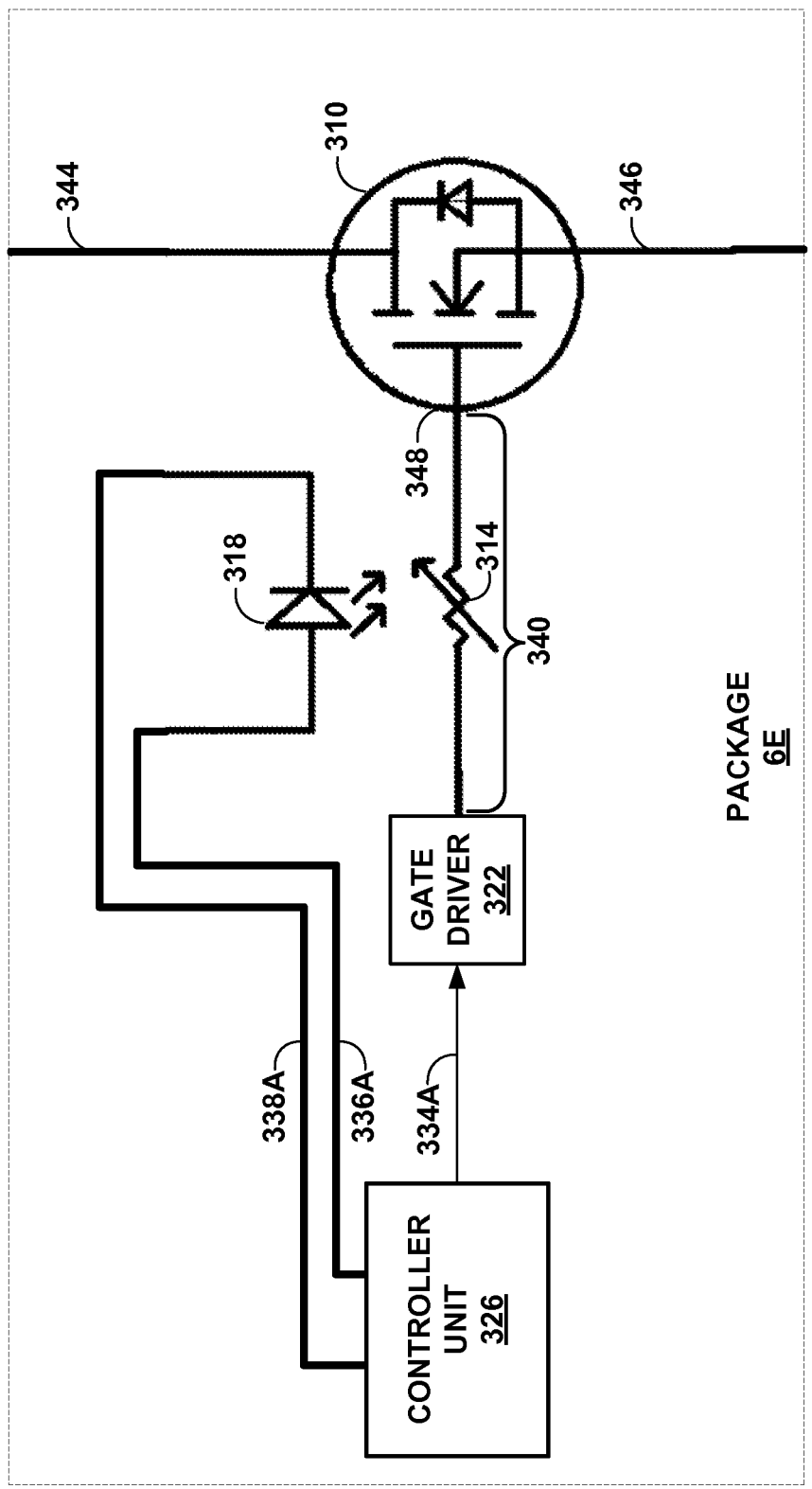
FIG. 4 is a circuit diagram illustrating an additional example of a package with an adjustable internal gate resistor configured to reduce gate oscillation at the voltage controlled circuit element, in accordance with one or more aspects of the present disclosure.

FIG. 4 is a circuit diagram illustrating an additional example of a package with an adjustable internal gate resistor configured to reduce gate oscillation at the voltage controlled circuit element, in accordance with one or more aspects of the present disclosure. FIG. 4 will be described within the context of system 1 of FIG. 1, and package 6A and gate driver 22. However, the techniques described below can be used in any permutation, and in any combination, with package 6B and gate driver 24 to prevent or reduce damage from occurring as a result of gate oscillation of a voltage controlled circuit element.

In the example of FIG. 4, package 6E includes voltage controlled circuit element 310, photoresistor 314, semiconductor light source 318, gate driver 322, controller unit 326, link 334A, link 336A, and link 338A. The components of package 6E may correspond to voltage controlled circuit element 10, photoresistor 14, semiconductor light source 18, gate driver 22, controller unit 26, links 34, links 36, and links 38 as described in FIG. 1. Additionally, package 6E may further include drain 344, source 346, and gate 348. Although, a MOSFET symbol is shown in FIG. 4 as voltage controlled circuit element 310, any electrical device that is controlled by a voltage may be used in place of the MOSFET as described in FIG. 1 with respect voltage controlled circuit element 10.

Gate driver 322 may correspond to gate driver 22 and may be located within package 6E. Controller unit 326 may correspond to controller unit 26 and may be located within package 6E. Drain 344 is the drain terminal of voltage controlled circuit element 310, which may be connected to power source 2 via link 8A or capacitor 28 via switching node 44. Source 346 is a source terminal of voltage controlled circuit element 310, which may be connected to power source 2 via link 8B or capacitor 28 via switching node 44. Gate 348 is a gate terminal of voltage controlled circuit element 310 coupled to gate driver 322 via photoresistor 314, and receives a voltage from gate driver 322 to either turn-on or turn-off voltage controlled circuit element 310.

Distance 340 may be the distance associated with an electrical trace between the output of gate driver 322 and the gate of voltage controlled circuit element 310. In some examples, distance 340 may be substantially less than distance 40A and distance 140 as described in FIGS. 1-2 because gate driver 322 is located in package 6E. In some examples, gate driver 322 may be located on the same semiconductor die as voltage controlled circuit element 310. In these examples, the gate stray inductance and the gate-drain capacitance across distance 340 of the electrical trace may be smaller than the gate stray inductance and the gate-drain capacitance across distance 40A of the electrical trace because gate driver 322 is located in the same package. The smaller gate stray inductance and the gate-drain capacitance across distance 340 of the electrical trace may help attenuate the gate oscillation and prevent or at least reduce the damage caused by the electromagnetic interference.

In some examples, controller unit 326 may be within the same package as voltage controlled circuit element 310. In some examples, controller unit 326 may be located on the same semiconductor die as voltage controlled circuit element 310. In these examples, controller unit 326 may individually control semiconductor light source 318 according to the specific characteristics of voltage controlled circuit element 310. For example, controller unit 326 may provide an amount of current to semiconductor light source 318 via links 336A and 338A to generate an amount of light, which may cause photoresistor 314 to have a fixed resistance value according the amount of light generated. In other examples, controller unit 326 may provide an amount of current to semiconductor light source 318 via links 336A and 338A based on whether voltage controlled circuit element 310 will be transitioning to or operating in an ON state or an OFF state. In these examples, the amount of current provided to semiconductor light source 318 may generate an amount of light, which may cause photoresistor 314 to have a specific or selected resistance value (e.g., a TURN ON resistance value or a TURN OFF resistance value).

In some examples, semiconductor light source 318 and photoresistor 314 may be encased in a transparent material, which may be surrounded by an opaque material to isolate photoresistor 314 from any light except for light from semiconductor light source 318. Semiconductor light source 318 may also be configured to deliver light into a light guide material that delivers the light to photoresistor 314. For example, the light guide material may be positioned in proximity to semiconductor light source 318 with an opaque material covering some or all of the elements in package 6E.

Figure 5:
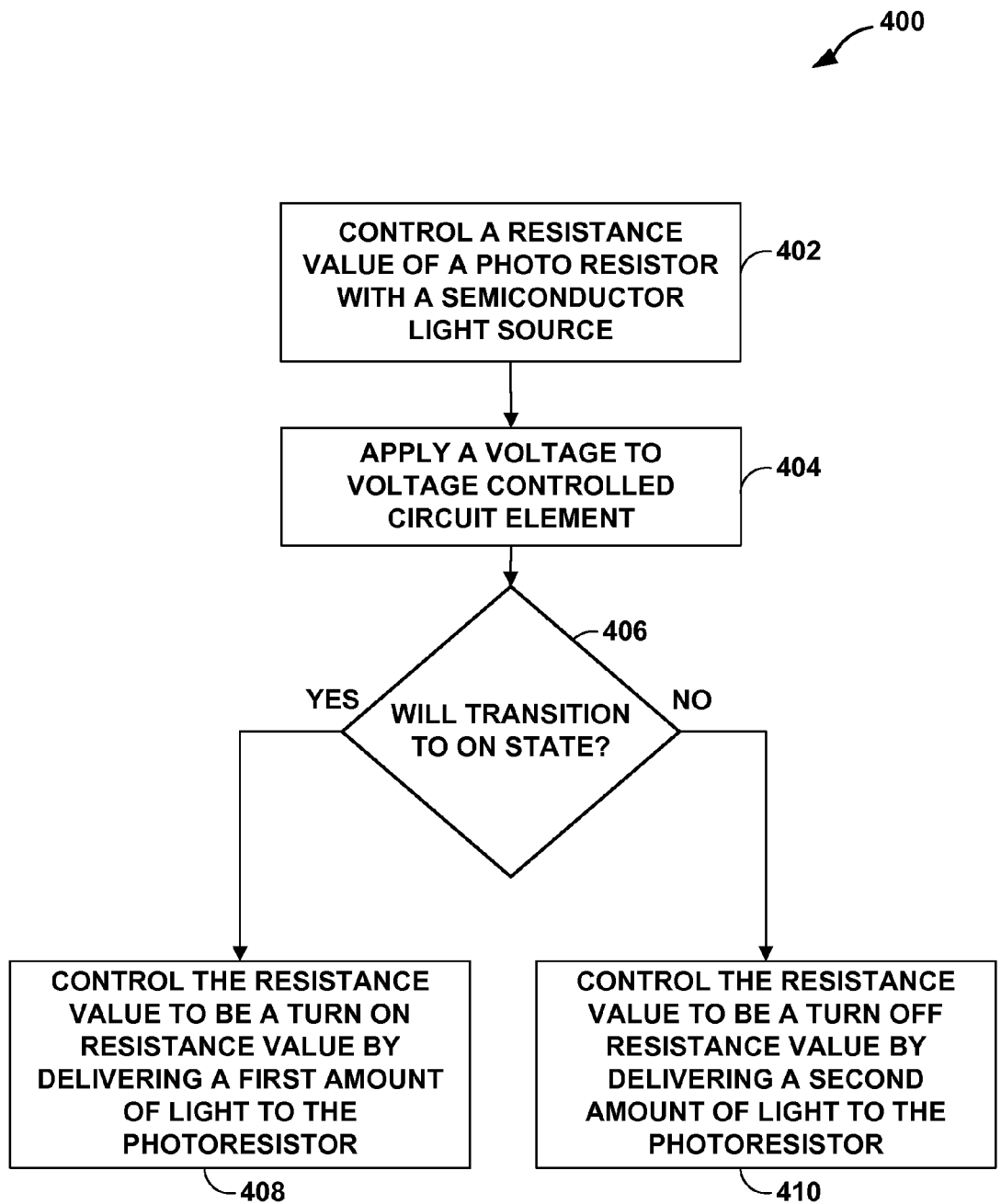
FIG. 5 is a flowchart illustrating an example of operations for reducing gate oscillation at the voltage controlled circuit element, in accordance with one or more aspects of the present disclosure.

FIG. 5 is a flowchart illustrating an example of operations for reducing gate oscillation at the voltage controlled circuit element, in accordance with one or more aspects of the present disclosure. FIG. 5 will be described within the context of FIG. 1, and package 6A and gate driver 22. However, the techniques described below can be used in any permutation, and in any combination, with package 6B and gate driver 24 to prevent or reduce damage from occurring as a result of gate oscillation of a voltage controlled circuit element. In some examples, operations 400 shown in FIG. 5 may be performed by controller unit 26, driver 22, driver 24, and/or a combination thereof.

In the example of FIG. 5, controller unit 26 may control a resistance value of photoresistor 14 coupled to voltage controlled circuit element 10 with semiconductor light source 18 (402). In some examples, controlling the resistance value of photoresistor 14 may include setting a fixed resistance value. In these examples, setting a fixed resistance values may further include generating an amount of light with semiconductor light source 18, and delivering the amount of light to photoresistor 14. In other examples, controlling the resistance value of photoresistor 14 may include setting one of a TURN ON resistance value or a TURN OFF resistance value. In these examples, setting one of the TURN ON resistance value or the TURN OFF resistance value may further include generating one of a first amount of light corresponding to the TURN ON resistance value or a second amount of light corresponding to the TURN OFF resistance value with semiconductor light source 18, and delivering the one of the first amount of light or the second amount of light to photoresistor 14. In these examples, delivering the first amount of light to photoresistor 14 may be based upon a signal from controller unit 26 that indicates voltage controlled element 10 will be transitioning to or operating in an ON state. In these examples, delivering the second amount of light to photoresistor 14 may be based upon a signal from controller unit 26 that indicates voltage controlled element 10 will be transitioning to or operating in an OFF state. In some examples, controlling the resistance value of photoresistor 14 with semiconductor light source 18 may include changing an amount of light generated by semiconductor light source 18. In these examples, changing the amount of light generated by semiconductor light source 18 may include one of increasing a current or decreasing the current through semiconductor light source 18.

In the example of FIG. 5, gate driver 22 may apply a voltage to voltage controlled circuit element 10, and controlling the resistance value of photoresistor 14 may control a voltage drop across photoresistor 14, which may also control the voltage applied at voltage controlled circuit element 10 so as to control a current through voltage controlled circuit element 10 (404). In other words, the resistance of photoresistor 14 may control the gate current to gate terminal, which may limit the switching speed of voltage controlled circuit element 10.

In the example of FIG. 5, controller unit 26 may determine whether the voltage controlled circuit element 10 will be transitioning to or operating in one of the ON state or the OFF state (406). Upon determining that voltage controlled circuit element 10 will be transitioning to or operating in an ON state, controller unit 26 may control the resistance value of photoresistor 14 to be a TURN ON resistance value by delivering a first amount of light to photoresistor 14 (408). In contrast, upon determining that voltage controlled circuit element 10 will not be transitioning to or operating in an ON state, controller unit 26 may control the resistance value of photoresistor 14 to be a TURN OFF resistance value by delivering a second amount of light to photoresistor 14 (410).

Figure 6:
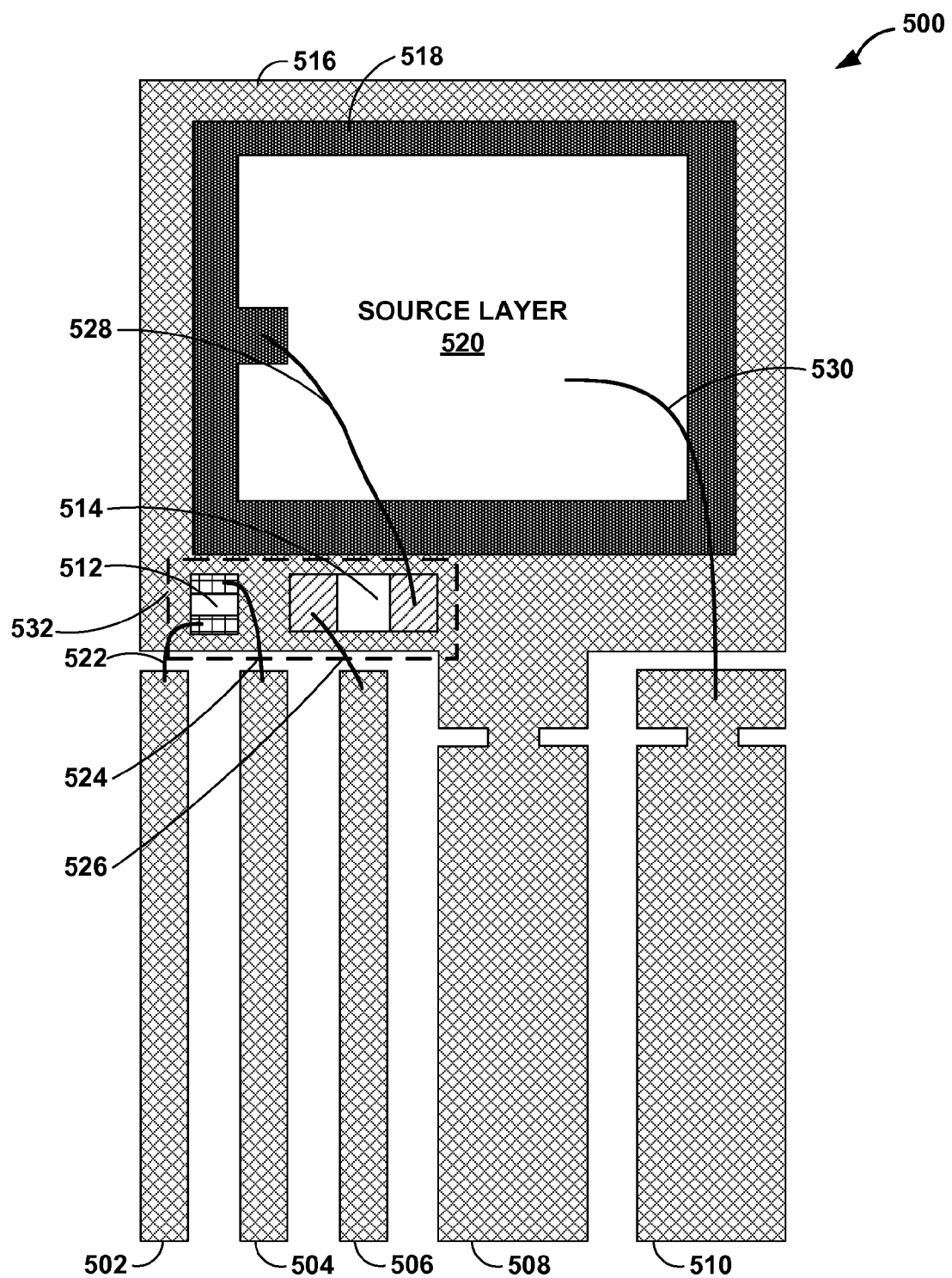
FIGS. 6-8 are conceptual diagrams illustrating example structures of a package with a voltage controlled circuit element and an adjustable internal gate resistor, in accordance with one or more aspects of the present disclosure.
Figure 7:
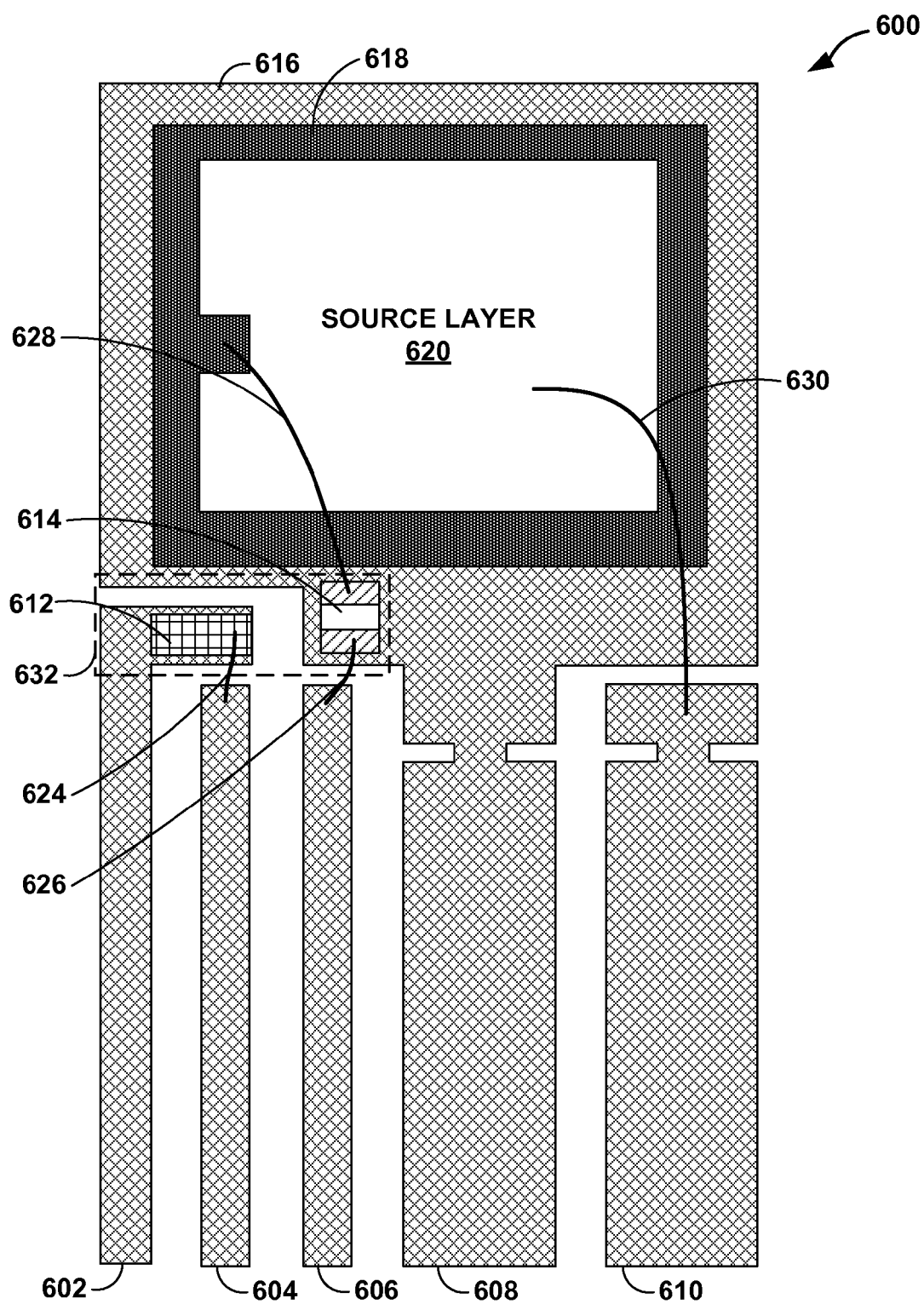
Figure 8:
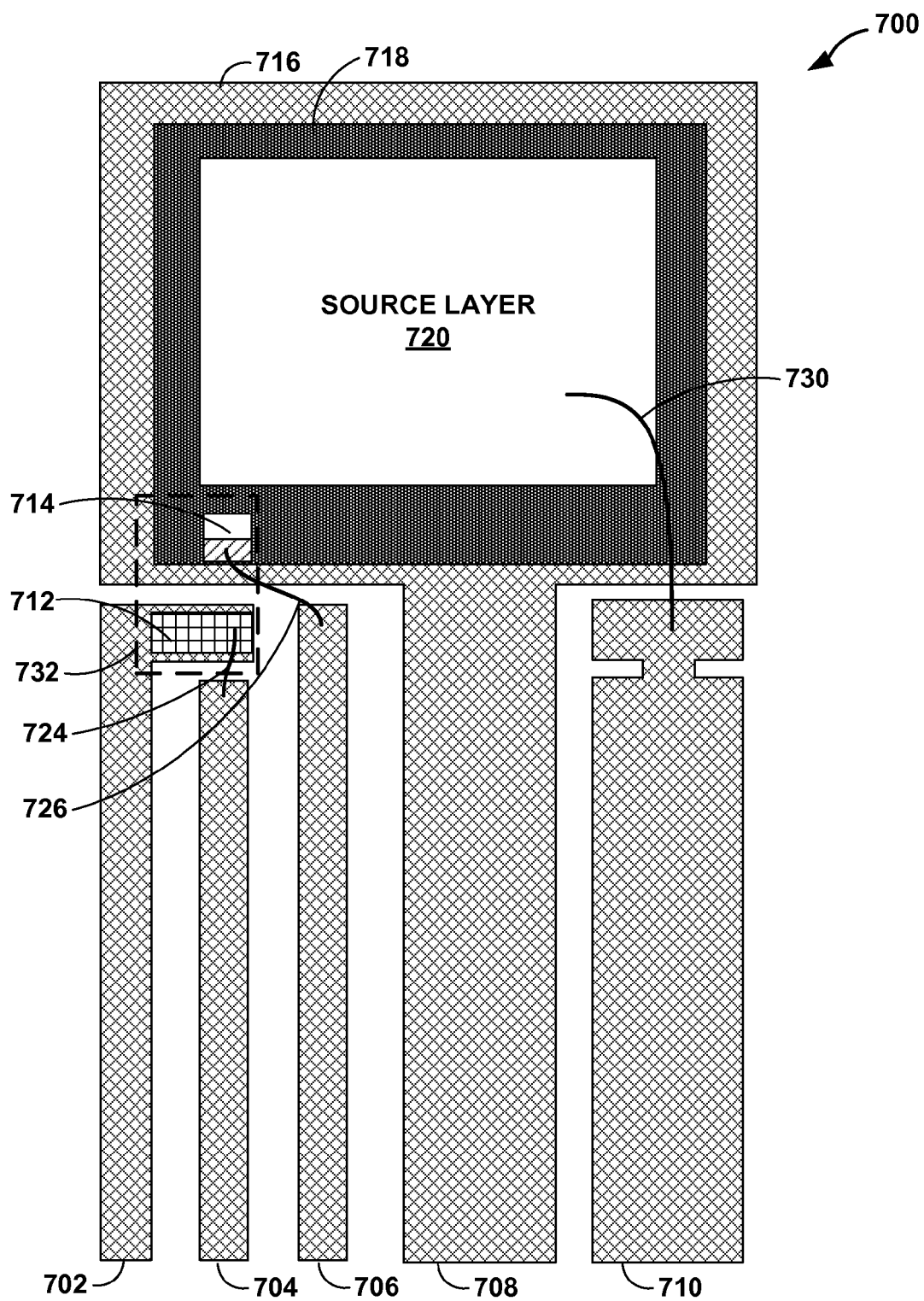

FIGS. 6-8 are conceptual diagrams illustrating example packages with a voltage controlled circuit element and an adjustable internal gate resistor, in accordance with one or more aspects of the present disclosure. In some examples, circuits and techniques described in FIG. 6 may apply to package 500, package 600, and package 700, and/or a combination thereof.

In the example of FIG. 6, package 500 includes cathode terminal 502, anode terminal 504, gate resistor terminal 506, drain terminal 508, source terminal 510, semiconductor light source 512, photoresistor 514, drain layer 516, gate layer 518, source layer 520, links 522-530, and transparent material 532. In some examples, package 500 corresponds to package 6A-6C.

Cathode terminal 502 is a conductor that allows current to flow out of semiconductor light source 512 and package 500. Anode terminal 504 is a conductor that allows current to flow into package 500 and semiconductor light source 512. Gate resistor terminal 506 is a conductor that allows current to flow into package 500 and a voltage to be applied at photoresistor 514. Drain terminal 508 is a conductor that allows current to flow into and out of the drain of a MOSFET and package 500. Source terminal 510 is a conductor that allows current to flow into and out of the source of a MOSFET and package 500.

Semiconductor light source 512 is any electrical device that emits light when activated, that is, exhibits electroluminescence (e.g., light-emitting diode (LED), organic light-emitting diode (OLED), quantum dot light-emitting diodes (QD-LED), and the like). Semiconductor light source 512 in combination with photoresistor 514 is an adjustable internal gate resistor with respect to package 500.

Photoresistor 514 may include any electrical device that exhibits resistance dependent upon incident light, that is, exhibits photoconductivity. Examples of photoresistor 514 may include a photoresistor, a light-dependent resistor (LDR), a photocell, or another element that exhibits resistance dependent upon incident light. Photoresistor 514 may comprise a gate resistor connected between the output of a gate driver and gate layer 518 of a voltage controlled circuit element (e.g., a MOSFET or IGBT). In some examples, the resistance value of photoresistor 514 may decrease as an increase of incident light is delivered to photoresistor 514. In other examples, the resistance value of photoresistor 514 may increase as a decrease of incident light is delivered to photoresistor 514.

Drain layer 516 may include a drain of a voltage controlled circuit element (e.g., voltage controlled circuit element 10 or 12 as described in FIG. 1). In some examples, drain layer 516 may be an indirect drain layer, such that drain layer 516 may be a lead frame area that is soldered to a drain layer that is on the backside of the die. In other words, drain layer 516 may be in direct contact to the drain layer at the backside of the die via a layer of conductive solder. In some examples, drain layer 516 may include the layer through which carriers leave the channel of the voltage controlled circuit element. Gate layer 518 includes a gate of a voltage controlled circuit element (e.g., voltage controlled circuit element 10 or 12 as described in FIG. 1). In some examples, gate layer 518 may include the layer at which a voltage is applied to the voltage controlled circuit element. Source layer 520 may include a source of a voltage controlled circuit element (e.g., voltage controlled circuit element 10 or 12 as described in FIG. 1). In some examples, source layer 520 may include the layer through which carriers enter the channel of the voltage controlled circuit element.

Links 522-530 may include any medium capable of conducting electrical power from one location to another. Examples of links 522-530 may include, but are not limited to, physical electrical transmission mediums such as electrical wires, electrical traces, or another physical electrical transmission medium. Link 522 electrically couples cathode terminal 502 to a cathode of semiconductor light source 512. Link 524 electrically couples anode terminal 504 to an anode of semiconductor light source 512. Link 526 electrically couples gate terminal 506 to a first terminal of photoresistor 514. Link 528 electrically couples photoresistor 514 to gate layer 518 of the voltage controlled circuit element. Link 530 electrically couples source terminal 510 to source layer 520 of the voltage controlled circuit element.

Transparent material 532 may include a light guide material (e.g., optical fibers) capable of allowing incidental light from one location to another, in some examples, using the principle of total internal reflection (TIR). Examples of transparent material 532 may include, but are not limited to, resin, polymer, or another transparent material that may be capable of having a clear molded shell which may enable the light from semiconductor light source 512 to be delivered to photoresistor 514, and temperature insulate photoresistor 514. In some examples, package 500 and transparent material 532 may be encased in an opaque material, isolating semiconductor light source 512, photoresistor 514, and transparent material 532 from any external light. In these examples, the opaque material may include, but are not limited to, resin, polymer, plastic mold compound, ceramic, or another opaque material that may be capable of insulating light from photoresistor 514 from an external source.

In the example of FIG. 6, package 500 includes five terminals. Cathode terminal 502 and anode terminal 504 may allow current to flow into and out of semiconductor light source 512, enabling semiconductor light source 512 to generate an amount of light. In some examples, the current flowing into and out of cathode terminal 502 and anode terminal 504 may be increased or decreased as desired to control (e.g., "adjust") the amount of light generated by semiconductor light source 512. In these examples, the current flowing into and out of cathode terminal 502 and anode terminal 504 may also be isolated from noise generated from a high speed switching circuit. Gate terminal 506 may allow current to flow into photoresistor 514, enabling a voltage to be applied by a gate driver at photoresistor 514. In some examples, the gate current to the gate terminal may depend on the amount of light generated by semiconductor light source 512. Drain terminal 508 may allow current to flow into or out of a voltage controlled circuit element. For example, a NMOS MOSFET may allow current to flow into package 500 via drain terminal 508. In another example, a PMOS MOSFET may allow current to flow out of package 500 via drain terminal 508. Source terminal 510 may allow current to flow into or out of a voltage controlled circuit element. For example, a NMOS MOSFET may allow current to flow out of package 500 via source terminal 510. In another example, a PMOS MOSFET may allow current to flow into package 500 via source terminal 510.

In the example of FIG. 6, package 500 includes semiconductor light source 512, photoresistor 514, and a voltage controlled circuit element formed by drain layer 516, gate layer 518, and source layer 520. In some examples, semiconductor light source 512 and photoresistor 514 are located on drain layer 516 (but electrically isolated from the drain layer) adjacent to gate layer 518. In some examples, semiconductor light source 512 and photoresistor 514 are encased in transparent material 532, which may allow light generated by semiconductor light source 512 to be delivered to photoresistor 514. In some examples, package 500 may be encased in an opaque mold compound (not shown), such that only photoresistor 514 receives light from semiconductor light source 512.

In some examples, semiconductor light source 512 may be configured to adjust a resistance value of photoresistor 514. In some examples, the voltage controlled circuit element, photoresistor 514, and semiconductor light source 512 may be located within package 500. In some examples, the voltage controlled circuit element, photoresistor 514, and semiconductor light source 512 may be located on the same semiconductor die. In some examples, a gate driver may be connected to gate terminal 506 and configured to drive the voltage controlled circuit element to one of an ON state or an OFF state. In some examples, a controller unit via the gate driver coupled to gate terminal 506 may be configured to drive the voltage controlled circuit element to one of an ON state or an OFF state. In some examples, the controller unit may be electrically coupled to cathode terminal 502 and anode terminal 504 and configured to set one or more resistance values of photoresistor 514. For example, the controller unit may be configured to provide a current to semiconductor light source 512 to generate and deliver an amount of light to photoresistor 514 corresponding to a fixed resistance value. In other examples, the controller unit may be configured to provide one of a first current to semiconductor light source 512 to generate and deliver a first amount of light corresponding to a TURN ON resistance value to photoresistor 514, or a second current to semiconductor light source 512 to generate and deliver a second amount of light corresponding to a TURN OFF resistance value to photoresistor 514. In these examples, the first amount of light may be based upon a signal from the controller unit that indicates the voltage controlled element will be transitioning to or operating in the ON state, and the second amount of light may be based upon a signal from the controller unit that indicates the voltage controlled element will be transitioning to or operating in the OFF state. In some examples, the controller unit may be configured to determine whether the voltage controlled circuit element may transition to or operate in one of the ON state or the OFF state, and responsive to determining that the voltage controlled circuit element may transition to or operate in the ON state, setting the resistance value to the TURN ON resistance value by providing the first current to semiconductor light source 512 via cathode terminal 502 and anode terminal 504 prior to the voltage controlled circuit element transitioning to or operating in the ON state. In some examples, the controller unit may be configured to determine whether the voltage controlled circuit element may transition to or operate in one of the ON state or the OFF state, and responsive to determining that the voltage controlled circuit element may transition to or operate in the OFF state, setting the resistance value to the TURN OFF resistance value by providing the second current to semiconductor light source 512 via cathode terminal 502 and anode terminal 504 prior to the voltage controlled circuit element transitioning to or operating in the OFF state.

In the example of FIG. 7, package 600 includes cathode terminal 602, anode terminal 604, gate resistor terminal 606, drain terminal 608, source terminal 610, semiconductor light source 612, photoresistor 614, drain layer 616, gate layer 618, source layer 620, links 624-630, and transparent material 632, which may correspond to package 500 including cathode terminal 502, anode terminal 504, gate resistor terminal 506, drain terminal 508, source terminal 510, semiconductor light source 512, photoresistor 514, drain layer 516, gate layer 518, source layer 520, links 524-530, and transparent material 532 as described in FIG. 6. In some examples, package 600 corresponds to package 6A-6C.

In the example of FIG. 7, package 600 may require one or more fewer links than package 500. For example, package 600 may not require link 522 as described in FIG. 6 because semiconductor light source 612 may be located on cathode terminal 602. In some examples, semiconductor light source 612 may be configured to adjust a resistance value of photoresistor 614. In some examples, the voltage controlled circuit element, photoresistor 614, and semiconductor light source 612 may be located within package 600. In some examples, the voltage controlled circuit element and photoresistor 614 may be located on the same semiconductor die. In some examples, transparent material 632 may encase semiconductor light source 612 and photoresistor 614 on separate semiconductor dies.

In the example of FIG. 8, package 700 includes cathode terminal 702, anode terminal 704, gate resistor terminal 706, drain terminal 708, source terminal 710, semiconductor light source 712, photoresistor 714, drain layer 716, gate layer 718, source layer 720, links 724-726 and 730, and transparent material 732, which may correspond to package 500 including cathode terminal 502, anode terminal 504, gate resistor terminal 506, drain terminal 508, source terminal 510, semiconductor light source 512, photoresistor 514, drain layer 516, gate layer 518, source layer 520, links 524-526 and 530, and transparent material 532 as described in FIG. 6. In some examples, package 700 corresponds to package 6A-6C and 600.

In the example of FIG. 8, package 700 may require one or more fewer links than package 500 and 600. For example, package 700 may not require link 628 as described in FIG. 6 because photoresistor 714 may be located on gate layer 718. For example, package 700 may not require link 522 as described in FIG. 6 because semiconductor light source 712 may be located on cathode terminal 702. In some examples, semiconductor light source 712 may be configured to adjust a resistance value of photoresistor 714. In some examples, the voltage controlled circuit element, photoresistor 714, and semiconductor light source 712 may be located within package 700. In some examples, photoresistor 714 may be located on gate layer 718 of the voltage controlled circuit element and on the same semiconductor die. In some examples, transparent material 732 may encase semiconductor light source 712 and photoresistor 714 on separate semiconductor dies.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. A method comprising:
controlling, by a semiconductor light source, a resistance value of a photoresistor coupled to a voltage controlled circuit element; and
applying, by a gate driver and via the photoresistor, a voltage to the voltage controlled circuit element to drive the voltage controlled circuit element to one of an ON state or an OFF state,
wherein controlling the resistance value of the photoresistor controls a voltage drop across the photoresistor to control the voltage applied at the voltage controlled circuit element so as to control a current through the voltage controlled circuit element.

2. The method of claim 1, wherein controlling the resistance value of the photoresistor comprises setting a fixed resistance value.

3. The method of claim 2, wherein setting the fixed resistance value
comprises: generating, by the semiconductor light source, an amount of light; and
delivering the amount of light to the photoresistor.

4. The method of claim 1, wherein controlling the resistance value of the photoresistor comprises setting one of a TURN ON resistance value or a TURN OFF resistance value.

5. The method of claim 4, wherein setting one of the TURN ON resistance value or the TURN OFF resistance value comprises:
generating, by the semiconductor light source, one of a first amount of light corresponding to the TURN ON resistance value or a second amount of light corresponding to the TURN OFF resistance value; and
delivering the one of the first amount of light or the second amount of light to the photoresistor.

6. The method of claim 5, wherein delivering the first amount of light to the photoresistor is based upon a signal from a controller unit that indicates the voltage controlled element will be transitioning to or operating in the ON state.

7. The method of claim 5, wherein delivering the second amount of light to the photoresistor is based upon a signal from a controller unit that indicates the voltage controlled element will be transitioning to or operating in the OFF state.

8. The method of claim 1, wherein controlling, by the semiconductor light source, the resistance value of the photoresistor comprises changing an amount of light generated by the semiconductor light source.

9. The method of claim 8, wherein changing the amount of light generated by the semiconductor light source comprises one of increasing a current or decreasing the current through the semiconductor light source.

10. The method of claim 1, further comprising determining whether the voltage controlled circuit element will be transitioning to or operating in one of the ON state or the OFF state; and
    responsive to determining that the voltage controlled circuit element will be transitioning to or operating in the ON state, controlling the resistance value to be a TURN ON resistance value by delivering a first amount of light to the photoresistor prior to the voltage controlled circuit element transitioning to or operating in the ON state.

11. The method of claim 1, further comprising determining whether the voltage controlled circuit element will be transitioning to or operating in one of the ON state or the OFF state; and
    responsive to determining that the voltage controlled circuit element will be transitioning to or operating in the OFF state, controlling the resistance value to be a TURN OFF resistance value by delivering a second amount of light to the photoresistor prior to the voltage controlled circuit element transitioning to or operating in the OFF state.

12. A circuit element comprising:
    a voltage controlled circuit element;
    a photoresistor coupled to the voltage controlled circuit element; and
    a semiconductor light source;
    a gate driver,
    wherein the semiconductor light source is configured to adjust a resistance value of the photoresistor,
    wherein the voltage controlled circuit element, the photoresistor, the semiconductor light source, and the gate driver are located within a package,
    wherein the gate driver is configured to drive the voltage controlled circuit element to one of an ON state or an OFF state, and
    wherein the gate driver is located on a same semiconductor die as the voltage controlled circuit element.

13. The circuit element of claim 12, further comprising:
    a controller unit; and
    a gate driver;
    wherein the controller unit via the gate driver is configured to drive the voltage controlled circuit element to one of an ON state or an OFF state, and wherein at least one of the gate driver and the controller unit is located within the package.

14. The circuit element of claim 13, wherein the controller unit is configured to set one or more resistance values of the photoresistor.

15. The circuit element of claim 14, wherein the controller unit is configured to provide a current to the semiconductor light source to generate and deliver an amount of light to the photoresistor.

16. The circuit element of claim 14, wherein the controller unit is configured to provide one of:
    a first current to the semiconductor light source to generate and deliver a first amount of light corresponding to a TURN ON resistance value to the photoresistor; or
    a second current to the semiconductor light source to generate and deliver a second amount of light corresponding to a TURN OFF resistance value to the photoresistor.

17. The circuit element of claim 16, wherein the first amount of light is based upon a signal from the controller unit that indicates the voltage controlled element will be transitioning to or operating in the ON state, and the second amount of light is based upon a signal from the controller unit that indicates the voltage controlled element will be transitioning to or operating in the OFF state.

18. The circuit element of claim 16, wherein the controller unit is configured to determine whether the voltage controlled circuit element will be transitioning to or operating in one of the ON state or the OFF state; and
    responsive to determining that the voltage controlled circuit element will be transitioning to or operating in the ON state, setting the resistance value to the TURN ON resistance value by providing the first current to the semiconductor light source prior to the voltage controlled circuit element transitioning to or operating in the ON state.

19. The circuit element of claim 16, wherein the controller unit is configured to determine whether the voltage controlled circuit element will be transitioning to or operating in one of the ON state or the OFF state; and
    responsive to determining that the voltage controlled circuit element will be transitioning to or operating in the OFF state, setting the resistance value to the TURN OFF resistance value by providing the second current to the semiconductor light source prior to the voltage controlled circuit element transitioning to or operating in the OFF state.

* * * * *